(12) United States Patent
Jackson et al.

(10) Patent No.: US 7,638,884 B2
(45) Date of Patent: Dec. 29, 2009

(54) THIN SEMICONDUCTOR DEVICE PACKAGE

(75) Inventors: James D. Jackson, Beaverton, OR (US); Damion T. Searls, Hillsboro, OR (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/348,803

(22) Filed: Jan. 5, 2009

(65) Prior Publication Data

US 2009/0109643 A1    Apr. 30, 2009

Related U.S. Application Data

(62) Division of application No. 11/403,400, filed on Apr. 12, 2006, now Pat. No. 7,517,732.

(51) Int. Cl.
*H01L 29/40*    (2006.01)
*H01L 21/301*    (2006.01)

(52) U.S. Cl. ............................. 257/781; 438/461

(58) Field of Classification Search .............. 438/123, 438/461, 611–613; 257/734, 781, E23.141–E23.179, 257/E23.01–E23.079
See application file for complete search history.

(56) References Cited

U.S. PATENT DOCUMENTS

| 6,034,427 | A  | * | 3/2000  | Lan et al. .................... 257/698 |
| 2002/0014667 | A1 | | 2/2002 | Shin et al. |
| 2002/0179564 | A1 | | 12/2002 | Geobegan et al. |
| 2003/0145461 | A1 | * | 8/2003 | Kasai et al. ................... 29/832 |
| 2006/0055021 | A1 | * | 3/2006 | Yamamoto .................. 257/690 |
| 2007/0099336 | A1 | | 5/2007 | Weston et al. |
| 2007/0152194 | A1 | | 7/2007 | Natekar |

* cited by examiner

*Primary Examiner*—Calvin Lee
(74) *Attorney, Agent, or Firm*—Blakely, Sokoloff, Taylor & Zafman LLP

(57) ABSTRACT

A thin semiconductor device package, comprising a thin substrate at least one thin die coupled with the substrate and having a perimeter dimension less than that of the substrate a mold material provided at a surface of the substrate adjacent to the perimeter of the die so that a surface of the mold material is coplanar with a surface of the die, and at least one electrically conductive pathway having at least one first terminal end configured to provide electrical continuity with the conductive element and at least one second terminal end formed at a surface of the mold material, the pathway extending from the first terminal end to the second terminal end.

14 Claims, 9 Drawing Sheets

THIN SEMICONDUCTOR DEVICE PACKAGE

This is a Divisional application of Ser. No. 11/403,400 filed Apr. 12, 2006, now U.S. Pat. No. 7,517,732.

FIELD OF THE INVENTION

The invention relates generally to the field of semiconductor device manufacturing. In particular, the invention relates to thin semiconductor device packages.

BACKGROUND OF THE INVENTION

Increasingly over the past decade, creating smaller and easily portable electronic devices has become a major force driving innovation in product design and technology. This trend has been frustrated to some extent by a coinciding demand for greater functionality, which may require the addition of more components into a device, or growth in the size of existing components to provide additional functions.

Semiconductor (solid state) circuit devices (referred to also as 'chips' or 'die') are an essential constituent component of most, if not all electronic devices in use today and being designed for the future. In many designs, die are attached to somewhat larger 'package substrates' which provide sufficient surface area for 'breaking out' the electrical signal from dense interconnect arrays to a number of electrical pathways, or traces, on an even larger substrate. Such package substrates are typically formed as multiple layers of glass fiber, organic resins, copper, and solder mask material. The copper is lithographically or otherwise formed into thin traces at multiple levels of the substrate. Many of the traces then spread outward through the package substrate and connect with vias to provide electrical continuity between electrical interconnects of the die and an array of, for example, solder balls on the opposite side of the substrate from the die. The solder balls provide both physical and electrical attachment to a larger substrate on which other components of the device may reside.

Package substrates, however, present numerous drawbacks detrimental to the objective of designing very small and relatively inexpensive portable electronic devices. For one, the package substrate may be the most expensive part of a package, and this cost goes up as the number of layers in the substrate increases, largely driven by the size and density of a die interconnect array. Further, as the thickness of the package substrate increases, so the overall thickness of the package increases, consuming valuable space in an electronic device, and either constraining or even increasing the minimum size that the device can be designed. Therefore, as mentioned, the complexity of a die to support increased functionality frequently drives a corresponding increase in the size and cost of the package and the overall device.

Further, the longer the electrical pathways are formed to sufficiently break out an interconnect array in a package, the more the electrical performance of the package, and therefore the device, is detrimentally impacted. Thick substrates may also hinder effective thermal dissipation from a device by retaining thermal energy close to the die that should preferably be dissipated away through a passive or active thermal device, such as a heat sink. To counter this, many current designs include a heat spreader attached to the die to more effectively draw heat away from a die. As can be expected, heat spreaders add both cost and size to device packages and electronic devices.

Some manufacturers have taken steps to reduce the size of the cores of package substrates, and coreless substrates have also been proposed. While these approaches do help to reduce the size of package substrates from 1 millimeter or more down to approximately 300 microns in some representative package substrates, they still pose a substantial impediment to further reduction of package size, as well as insufficiently resolving many of the other associated deficiencies described here. Significant challenges remain to further reducing the size and cost of highly functional portable electronic devices to keep pace with the demand for such in the market.

DETAILED DESCRIPTION OF THE INVENTION

Figure 1:
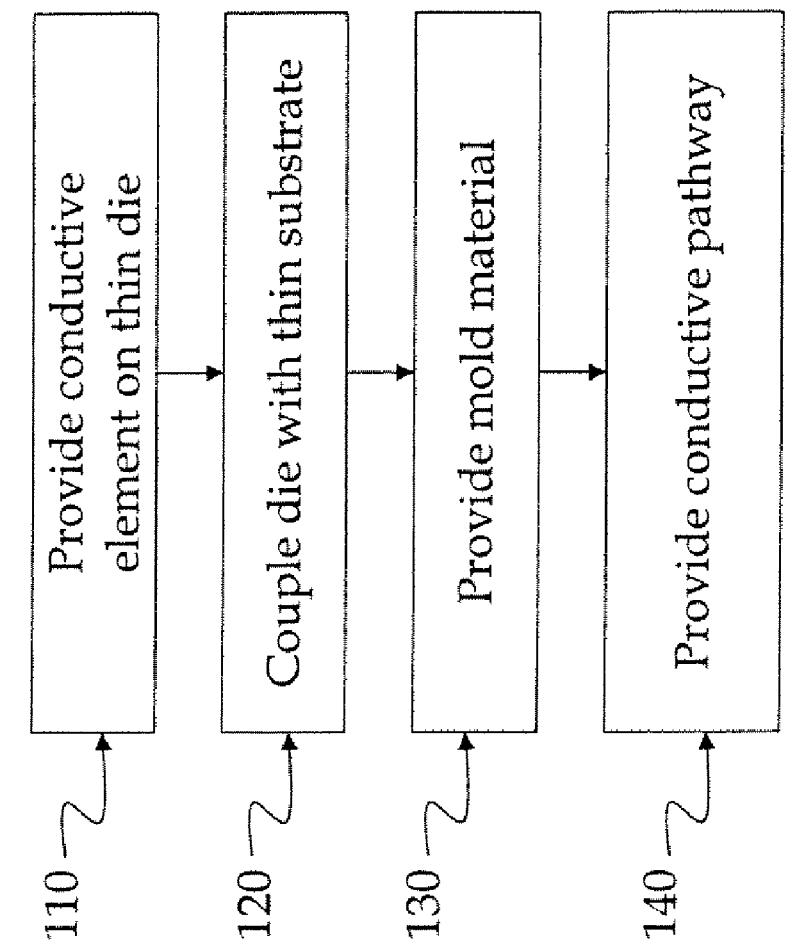
FIG. 1 depicts an embodiment of a method for forming a thin semiconductor device package.

Forming a thin semiconductor device package (package), as depicted in an embodiment in FIG. 1 at 100, includes providing at least one conductive element at a surface of a die, as at 110, coupling the die with a substrate, as at 120, providing a mold material at a surface of the substrate, as at 130, and providing at least one conductive pathway configured to provide electrical continuity with the conductive element, as at 140. This and other embodiments are described below in greater detail.

Figure 2:
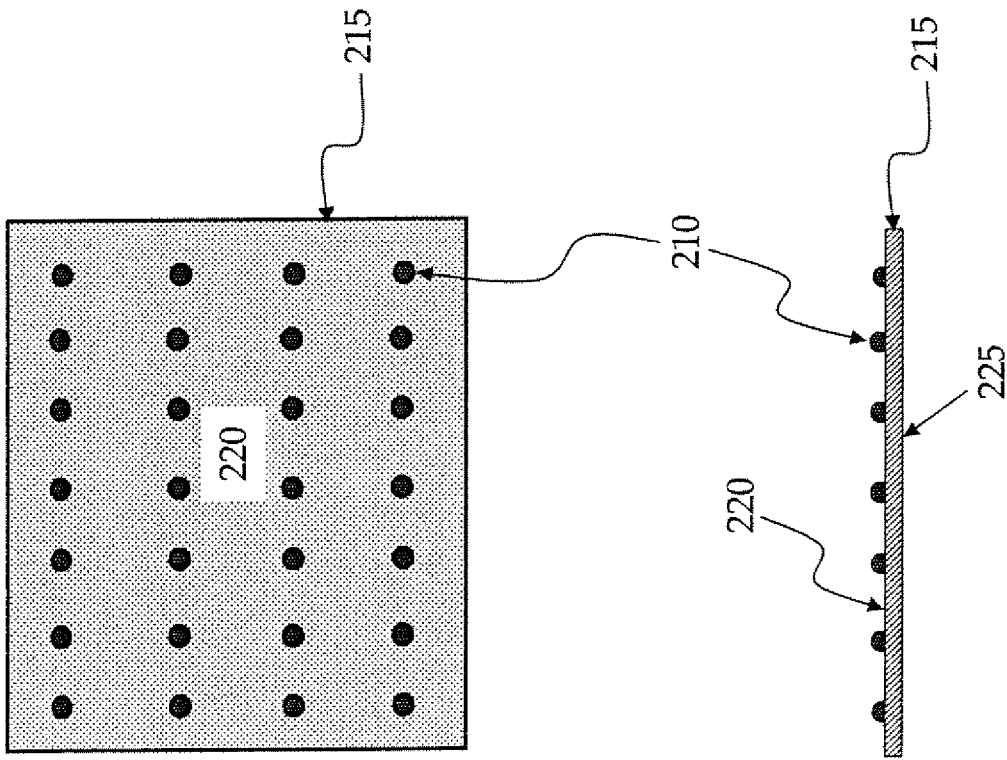
FIG. 2a depicts in top view.
FIG. 2b depicts in cross-sectional view, a thin die with electrically conductive elements formed at a first side of the die, according to an embodiment of the invention.

As depicted in FIGS. 2a and 2b, a method for forming a thin semiconductor device package includes providing at least one electrically conductive element (element) 210 at a first surface 220 of a die 215. An element 210 may be formed of a metallic material, an electrically conductive organic material, or some other electrically conductive material. In embodiments having a plurality of elements 210, the elements may be arranged in an evenly spaced array, as shown in FIG. 2a. Alternatively, at least one pair of elements may be a spaced a greater distance apart than at least another pair of elements of the array, A die 215, is a thin die in most embodiments of the invention, however, package size reduction benefits may be obtained even where the die is not a thin die. For example, a thin die may be approximately 0.78 millimeter (780 μm) or less in thickness, however, a die which is greater than 0.78 millimeter in thickness may also be used in a thin package wherein other materials in the package are sufficiently thin to provide an overall package that is thin.

While in some embodiments an element 210 is formed at a first surface 220 of a die 215, an element may alternately be formed at a plane recessed below the plane of the first surface 220, having a portion of the element presented at or very near the plane of the first surface 220. Further, an element 210 may be formed upon the first surface 220 so that the element 210 lies in substantially the same plane as the first surface 220 of the die 215, or maybe formed so that, when viewed in profile, a portion of the element 210 extends beyond the plane of the first surface 220 of the die 215. In each of the embodiments presented here, the element is considered to be provided at the first surface 220 of the die 215.

Figure 3:
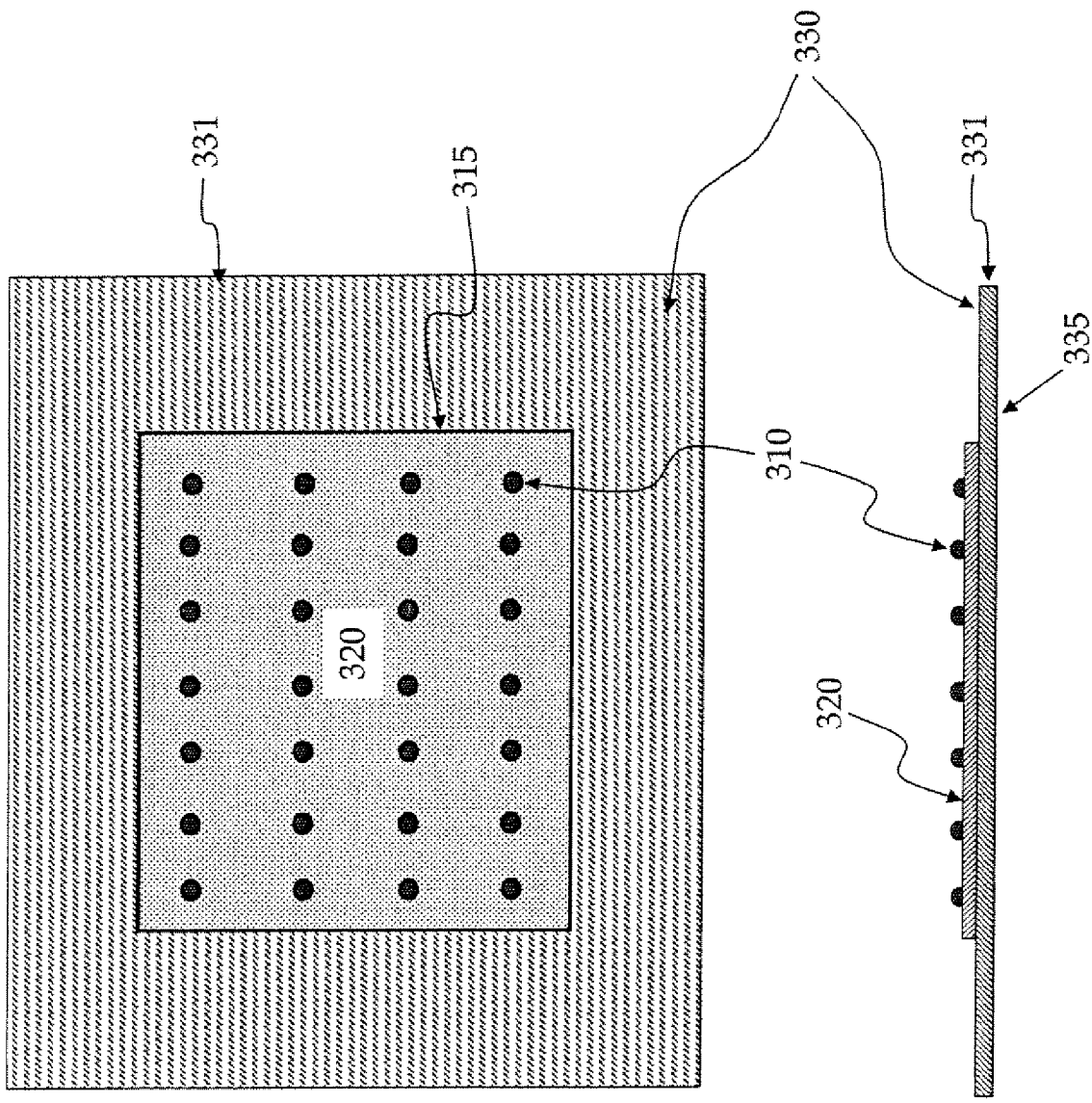
FIG. 3a depicts in top view.
FIG. 3b depicts in cross-sectional view, a thin die coupled with a thin substrate, according to an embodiment of the invention.

A die 215 generally also has a second surface 225 lying within a plane parallel or substantially parallel with respect to the first surface 220, and each of the first surface 220 and the second surface 225 may be substantially planar. As shown in FIG. 1 at 120, and in an embodiment depicted in FIGS. 3a and 3b, a second surface 225 of at least one thin die 315 is coupled with a first surface 330 of a substrate 331 so that the first surface 320 of the die 315 and the elements 310 remain at least partially exposed. More than one die may also be coupled with a substrate, to form a multi-die ('multi-chip') package.

Generally, the substrate 331 is a thermally conductive material, for example, copper. The substrate 331 may also be formed thinly, enabling rapid thermal transfer throughout the substrate 331. In an exemplary embodiment, a substrate 331 is as thin as approximately 0.1 millimeter, although it also may be as thick as approximately 1.0 millimeter. Accordingly, a thin die 315 coupled with such exemplary substrates 331 will form a relatively thin semiconductor package. However, the invention should not be construed as limited to substrates having a thickness confined within a range of approximately 0.1-1.0 millimeter, as a thin package may be formed using somewhat thinner or thicker substrates when coupled with a thin die.

A substrate 331, like a die 315, will typically also have a second side 335 lying within a plane parallel or substantially parallel with respect to the first side 330 of the substrate 331. The dimension of the perimeter of the first surface 330 of a substrate 331, in embodiments, will be greater than that of the perimeter of the first surface of the one or more die 315 coupled with the substrate 331, such that a portion of the first surface 330 of the substrate 331 remains uncovered by the die 315.

Coupling a die 315 with a substrate 331 can be accomplished using a thermally conductive bonding material. Such bonding material, according to embodiments, may include a metallic solder material, a thermally conductive organic adhesive, or some other thermally conductive material capable of durably bonding a die 315 and a substrate 331, and maintaining a bond even when exposed to a wide range of thermal variation. A bonding material may also include a cold formed thermal interface material (TIM). However, bonding materials that do not add significantly to the overall thickness of a coupled die 315 and substrate 331 provide advantages in achieving a thin overall package.

As described above, a first surface 320 of a die 315 and a first surface 330 of a substrate 331 lie within parallel or substantially parallel planes with respect to each other. Here, as elsewhere in this description, planes described as being 'substantially parallel' may be nearly but not absolutely parallel, as may result from limitations in the ability to control conditions of operations or materials throughout the formation of embodiments of the invention.

Figure 4:
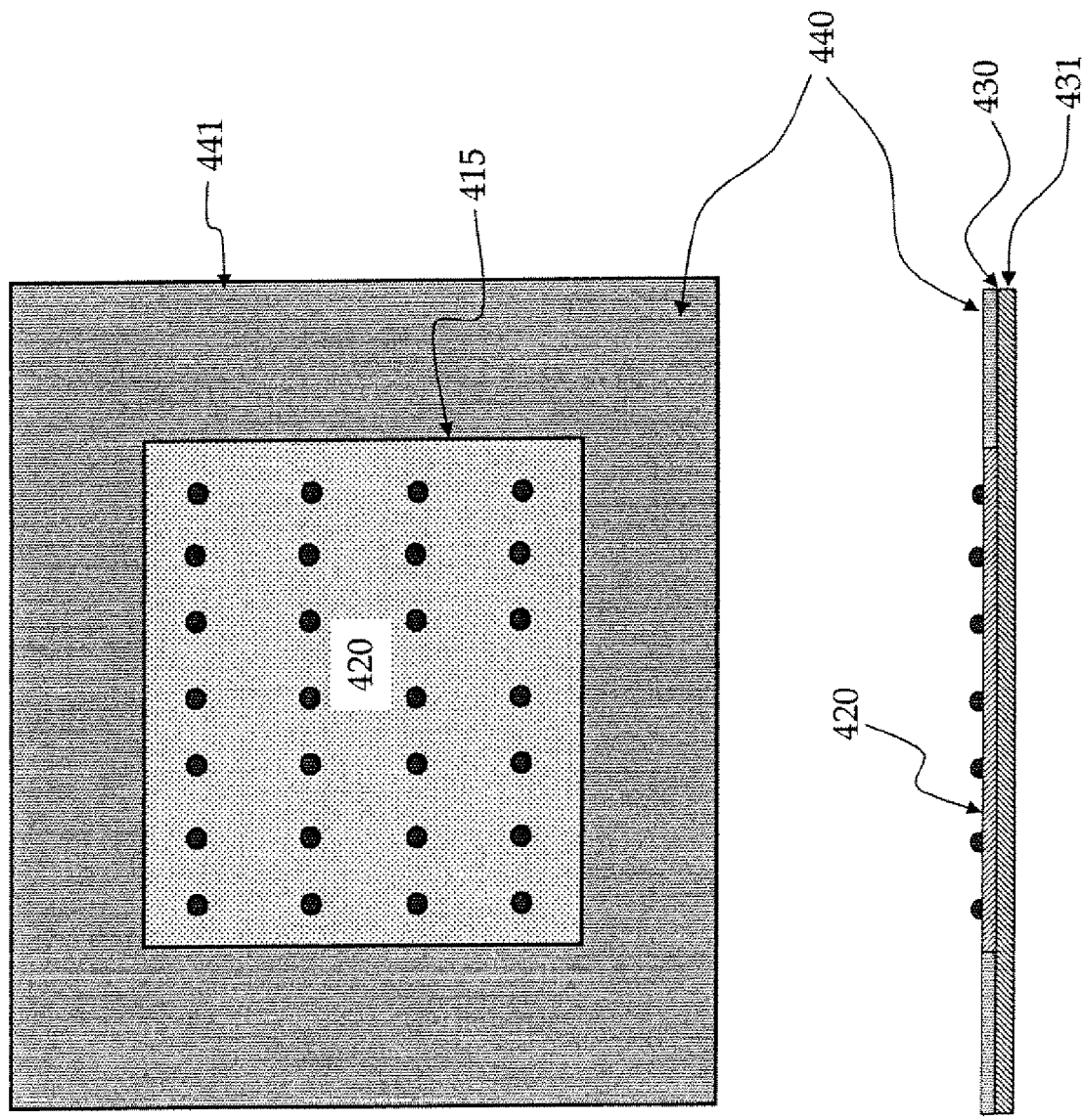
FIG. 4a depicts in top view.
FIG. 4b depicts in cross-sectional view, a mold material formed at a first side of a thin substrate, the mold material also having a surface coplanar with a surface of a thin die at which electrically conductive elements are formed, according to an embodiment of the invention.

As shown in the embodiment in FIG. 1 at 130, and further depicted in FIGS. 4a and 4b, a mold material 441 is provided at a first surface 430 of a substrate 431, adjacent to the perimeter of a die 415 coupled with the substrate 431. Providing a mold material 441 may include, according to various embodiments, dispensing, forming and curing a liquidous material, applying and adhering (e.g., laminating) a solid mold material, or disposing, forming, and curing a malleable semi-solid mold material, although other methods may also be used. The mold material 441 is provided with at least a first surface 440 that is coplanar or substantially coplanar with respect to the first surface 420 of the die 415, and also a second surface wherein the first and second surfaces lie within parallel or substantially parallel planes with respect to each other. Further, the second surface of the mold material 441 will generally lie in a plane parallel or substantially parallel with respect to, and adjacent to the first surface 430 of the substrate 431, so that the second surface of the mold material 441 is physically, and in embodiments, adhesively coupled with the first surface 430 of the substrate 431. The mold material, in embodiments, is provided at the first surface 430 of a substrate 431 so that a perimeter of the mold material 441 is fully coextensive with a perimeter of the substrate 431, as depicted in FIGS. 4a and 4b. In other embodiments, a perimeter of the mold material 441 may not be fully coextensive with a perimeter of the substrate 431, but larger or smaller than at least a portion of a perimeter of the substrate 431.

A die 415 includes a plurality of sides defining a perimeter of the die 415, and mold material 441 provided adjacent with a perimeter of the die 415 will dimensionally conform closely with at least a first side of the die. Thus, in embodiments, the first surface 440 of a provided mold material 441, closely conforming with at least a side of a die 415, forms an extended surface from the first surface 420 of the die. For descriptive purposes, a boundary of a provided mold material 441 proximate to and closely conforming with a side of a die 415 will be referred to as a 'die side edge' hereinafter. A die side edge of a mold material 441 will generally closely abut with a side of a die 415 so that a gap, or void, will be minimal or absent at a boundary between the die 415 and the die side edge of the mold material 441. In this manner, a surface formed by the coplanar or substantially coplanar first surfaces of the die 415 and the mold material 441 may form a contiguous or substantially contiguous surface.

Coefficients of thermal expansion (CTE) of materials used in embodiments of the invention for a mold material, die, substrate, and/or bonding material may not be equal to that of any or all of the other materials therein. Therefore, although disposed according to embodiments as described herein, when subjected to changing thermal conditions, materials in embodiments may expand or contract at different rates, altering physical and/or positional relationships within those embodiments at a second temperature ($T_2$) as compared to those same relationships at a first temperature ($T_1$). As preserving physical and/or positional relationships between materials, for example, dimensional relationships, may be advantageous, and because embodiments of the invention may be subjected to changing thermal conditions during manufacturing and/or use, materials having substantially uniform CTEs may be used in embodiments to minimize changes in those relationships within a range of thermal conditions. In an exemplary embodiment, using silicon filler as a substantial constituent material in a mold material will provide the mold material with a CTE closely matching that of a silicon die. In other embodiments, where slight changes in physical and/or positional relationships can be tolerated without detrimental impact, materials having less uniform CTEs can be used.

As described with regard to FIG. 1 at 140, and depicted in embodiments in FIGS. 5a and 5b, at least one electrically conductive pathway (pathway) 550, having at least a first terminal end 553 and at least a second terminal end 555, is provided at the first surface of the die 515 and the first surface of the mold material 440. The first terminal end 553 is configured to provide electrical continuity with at least one conductive element 510 at the first surface 520 of the die 515. The pathway extends from at least one first terminal end 553, outwardly relative to the center of the die 515 to at least one second terminal end 555 at the first surface 540 of the mold material 541, the location of the second terminal end 555 being at least partially outside the perimeter of the die 515.

In an exemplary embodiment, copper is disposed at the first surface 520 of the die 515 and the first surface 540 of the mold material 541. The copper is then lithographically patterned and etched so that copper pathways 550 remain. In another exemplary embodiment, copper nanopaste is printed at the first surfaces of the die 515 and mold material 541 using ink jet printing methods to form conductive pathways. Other methods of disposing copper nanopaste may be used according to other embodiments. Copper nanopaste provides benefits in that it sinters at a lower temperature than conventional copper paste materials. For example, copper nanopaste sinters at approximately 300° C., while a conventional copper paste sinters at approximately 400° C. or higher. In other embodiments, pathways may be formed of other conductive materials, such as silver. Although only a limited number of exemplary embodiments for forming pathways 550 are specifically described herein, one of ordinary skill in the art would recognize that the embodiments are not so limited.

Figure 7:
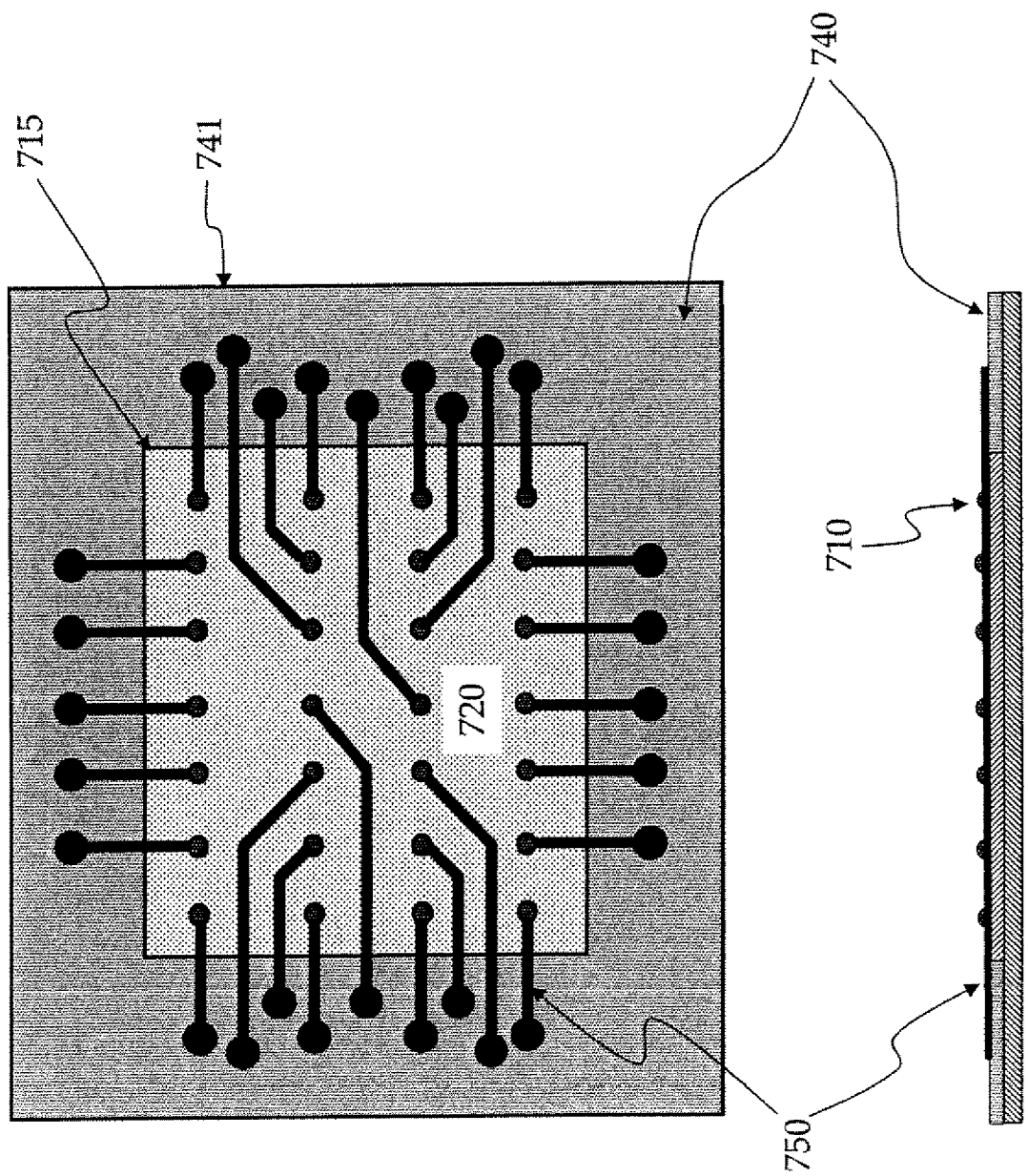
FIG. 7a depicts in top view.
FIG. 7b depicts in cross-sectional view, a plurality of electrically conductive pathways provided at a surface of a mold material at least partially outside the perimeter of a thin die each pathway configured to provide electrical continuity with at least one electrically conductive element provided at a surface of the thin die, according to an embodiment of the invention.

The pathways 550 may be configured as fine lines to allow routing electrical signals outward from a large number of conductive elements 510 at the first surface 520 of the die 515. Pathways 550 may be configured to provide electrical continuity with only elements 510 near the perimeter of a die 515, or as depicted in FIGS. 7a and 7b, pathways 750 may be configured to provide electrical continuity with electrical elements 710 closer to the center of the die 715 as well as near its perimeter. In embodiments, a plurality of conductive pathways 750 are formed and arranged at the respective first surfaces 720, 740 of a die 715 and mold material 741 so that each pathway 750 is physically and/or electrically isolated from each other pathway. A pathway may be configured to provide electrical continuity with more than one conductive element, and may have a plurality of first terminal ends. Likewise, a pathway may have a plurality of second terminal ends, while having either one first terminal end or a plurality of first terminal ends.

Figure 5:
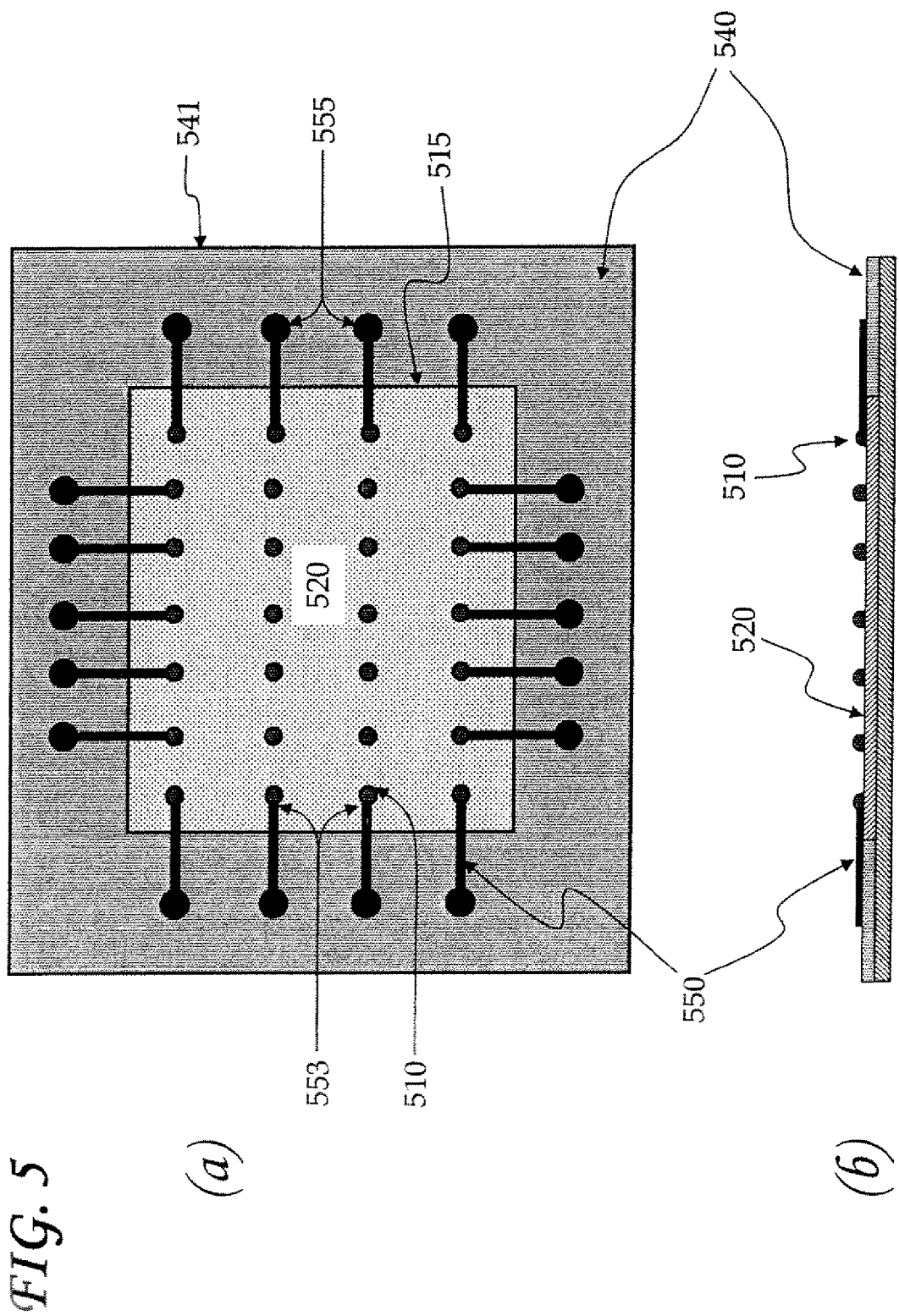
FIG. 5a depicts in top view.
FIG. 5b depicts in cross-sectional view, at least one electrically conductive pathway provided at a first surface of a mold material at least partially outside the perimeter of a thin die and configured to provide electrical continuity with at least one electrically conductive element provided at a surface of the die, according to an embodiment of the invention.
Figure 6:
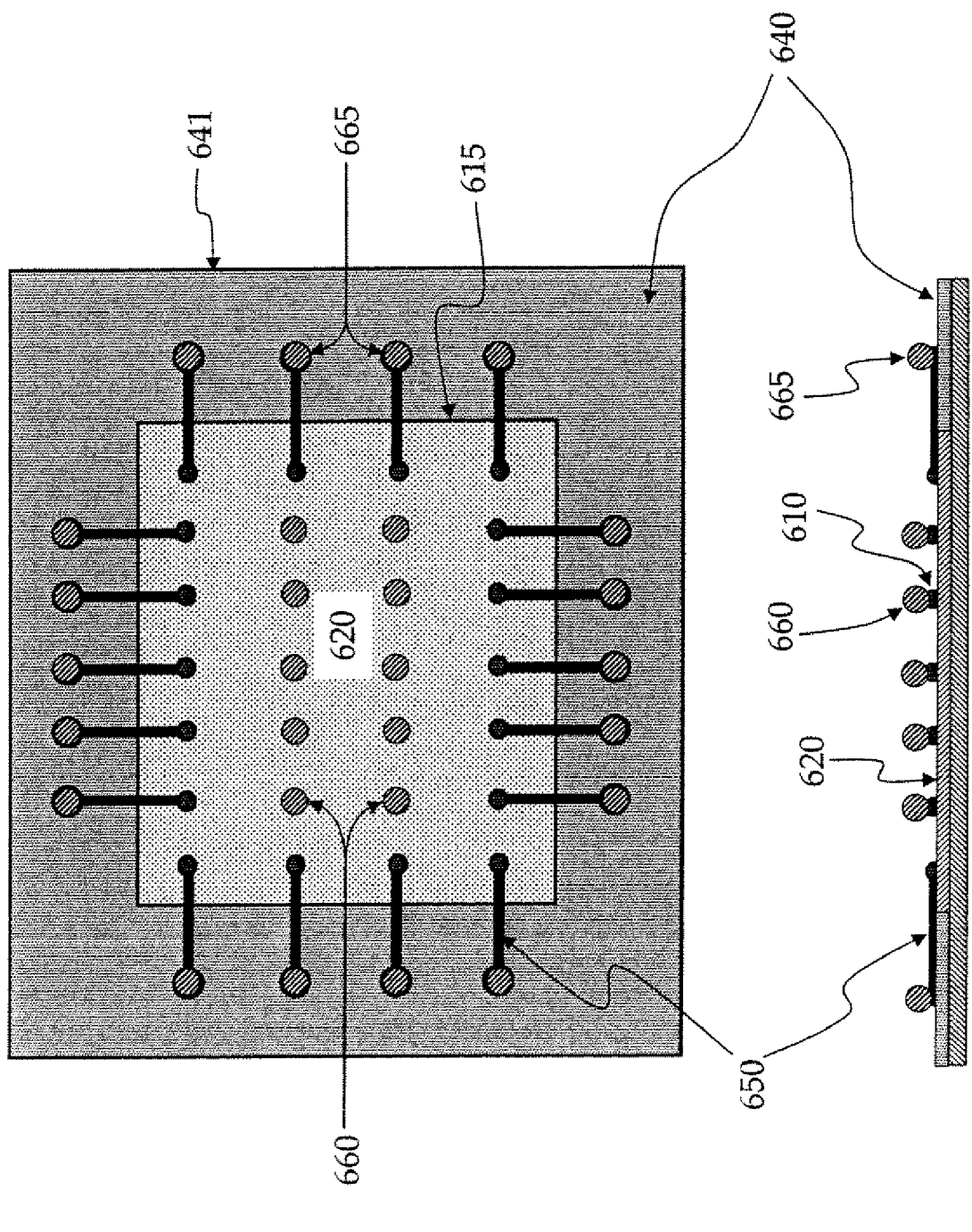
FIG. 6a depicts in top view.
FIG. 6b depicts in cross-sectional view, at least one attachment member coupled with at least one electrically conductive pathway at a surface of a mold material, and at least one attachment member coupled with at least one electrically conductive element provided at a surface of a thin die, according to an embodiment of the invention.

In an embodiment such as that depicted in FIG. 5, a second terminal end 555 (FIG. 5) of a pathway 550 is configured to electrically couple with an attachment member. In an exemplary embodiment depicted in FIG. 6, an attachment member is a solder ball 665, such as those used in ball grid array (BGA) devices. An attachment member may, however, be a solder bump, a controlled collapse chip connect (C4) structure, or a stud bump, although the embodiments of an attachment member are not so limited. Therefore, an attachment member may be provided at a first surface 640 of a mold material 641 and physically and/or electrically coupled with a second terminal end 555 of a pathway 650. As shown in FIGS. 6a and 6b, attachment members 660 may be physically and/or electrically coupled with conductive elements 610 that are not physically and/or electrically coupled with pathways 650 provided at a first surface 620 of a die 615. Therefore, in embodiments having a large number of conductive elements 610, where it may be difficult to route pathways 650 outward from all conductive elements 610, not all conductive elements 610 need to be provided with pathways. Rather, in an exemplary embodiment, an attachment member 660 provides electrical continuity between a conductive element 610 and a conductive element of a substrate with which a package is also physically coupled. Embodiments such as those depicted in FIGS. 6a and 6b may be considered BGA packages.

Figure 8:
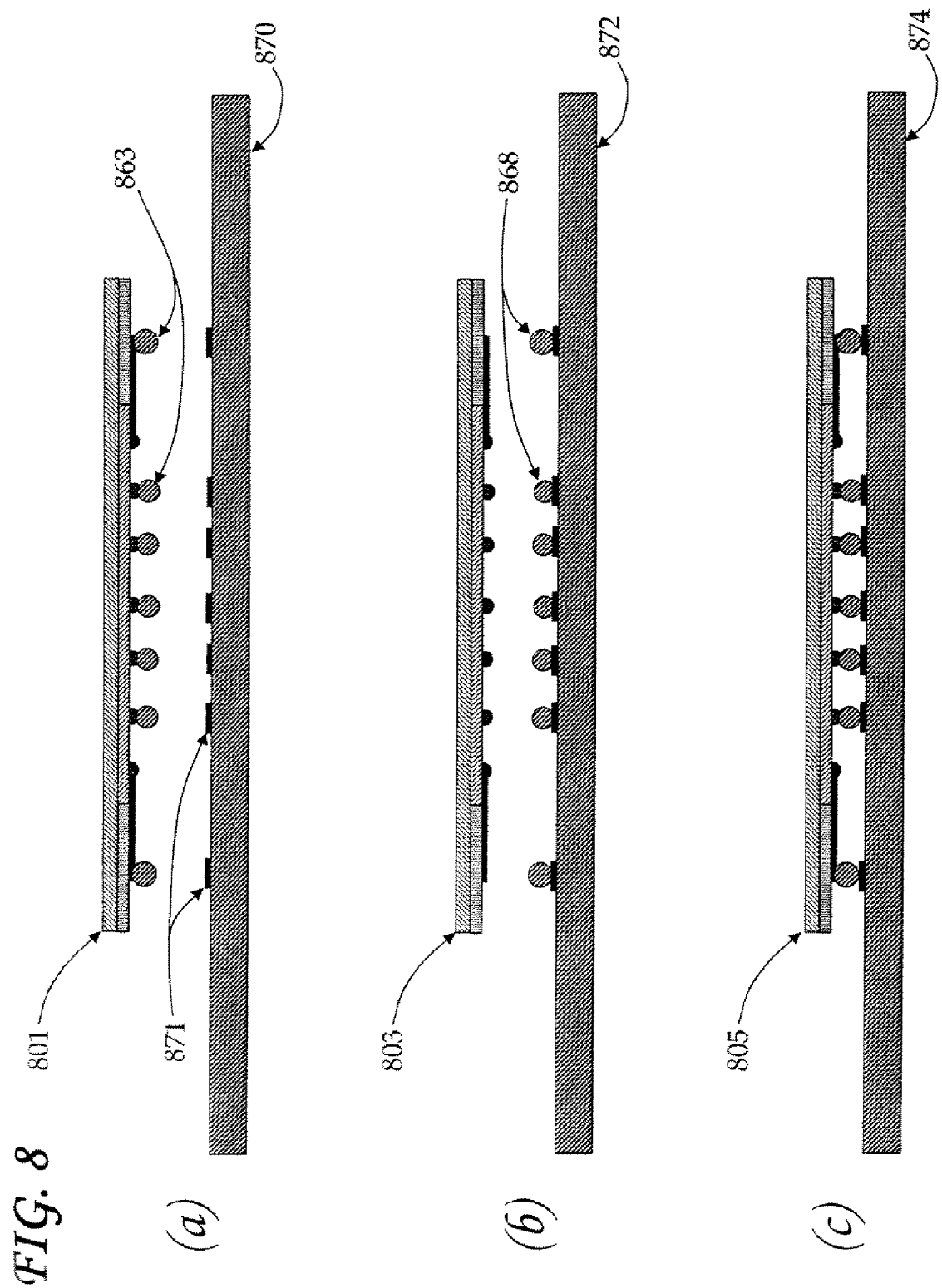
FIGS. 8a and 8b depict cross-sectional views of attachment members provided to couple a thin semiconductor device package with a substrate according to two embodiments of the invention.
FIG. 8c depicts a cross-sectional view an assembly including a thin semiconductor device package coupled with a substrate according to an embodiment of the invention.

In the embodiment depicted in FIG. 8a, attachment members 863 of a package 801 are arranged so as to couple physically and/or electrically with conductive elements 871 at a surface of a substrate 870. In other embodiments, such as that depicted in FIG. 8b, at least one attachment member 868 may be provided at a surface of a substrate 872, and becomes physically and/or electrically coupled with a package when the package 803 is coupled with the substrate, as depicted in FIG. 8c. In still other embodiments, at least one attachment member may be coupled with at least one conductive element of a package, and/or at least one second terminal end of a pathway of a package, and also with conductive elements 871 at a surface of a substrate, prior to coupling the package with the substrate. Whether attachment members are initially coupled with a package, as in the embodiment depicted in FIG. 8a, or with a substrate, as in the embodiment depicted in FIG. 8b, attachment members may couple a package 805 with a substrate 874 to form an electronic assembly, as depicted in an exemplary embodiment in FIG. 8c.

Embodiments of a thin semiconductor package described herein may be formed with a total thickness of less than approximately 1.6 millimeters, providing a very low profile package for use in applications with limited available space. Of course, packages thicker than approximately 1.6 millimeters may also be considered 'thin packages', however, they may not be suitable for some portable device applications.

In embodiments, the substrate 874 of an electronic assembly may be a printed circuit substrate of a portable electronic device in which a thin semiconductor device package may be used. Examples of portable electronic devices include devices configured for wireless communication (e.g., cellular phones), entertainment (e.g., MP3 music players), measurement (e.g., global positioning system unit), data collection (e.g., UPC code reader), computing (e.g., palm top computer), or any other device configured so that it may be carried from one location to another by a person. In embodiments, a portable device is designed to be installed and transported within a vehicle. In other embodiments, a substrate of an electronic assembly may be configured for use within a very confined space, and therefore must be of a relatively small size. In an exemplary embodiment, a device is a medical device configured for use inside a patient. Exemplary embodiments include a heart pacemaker or a device for enhancement of auditory function. A substrate may also be part of an assembly configured to be physically received and/or retained at least partially within an electronic device, or otherwise coupled therewith wherein the assembly is configured for either one-way or two-way transfer of electrical signals with the electronic device. An exemplary embodiment of such a substrate includes a printed circuit card (e.g. network communication card) configured for insertion into a slot of a portable personal computer.

Figure 9:
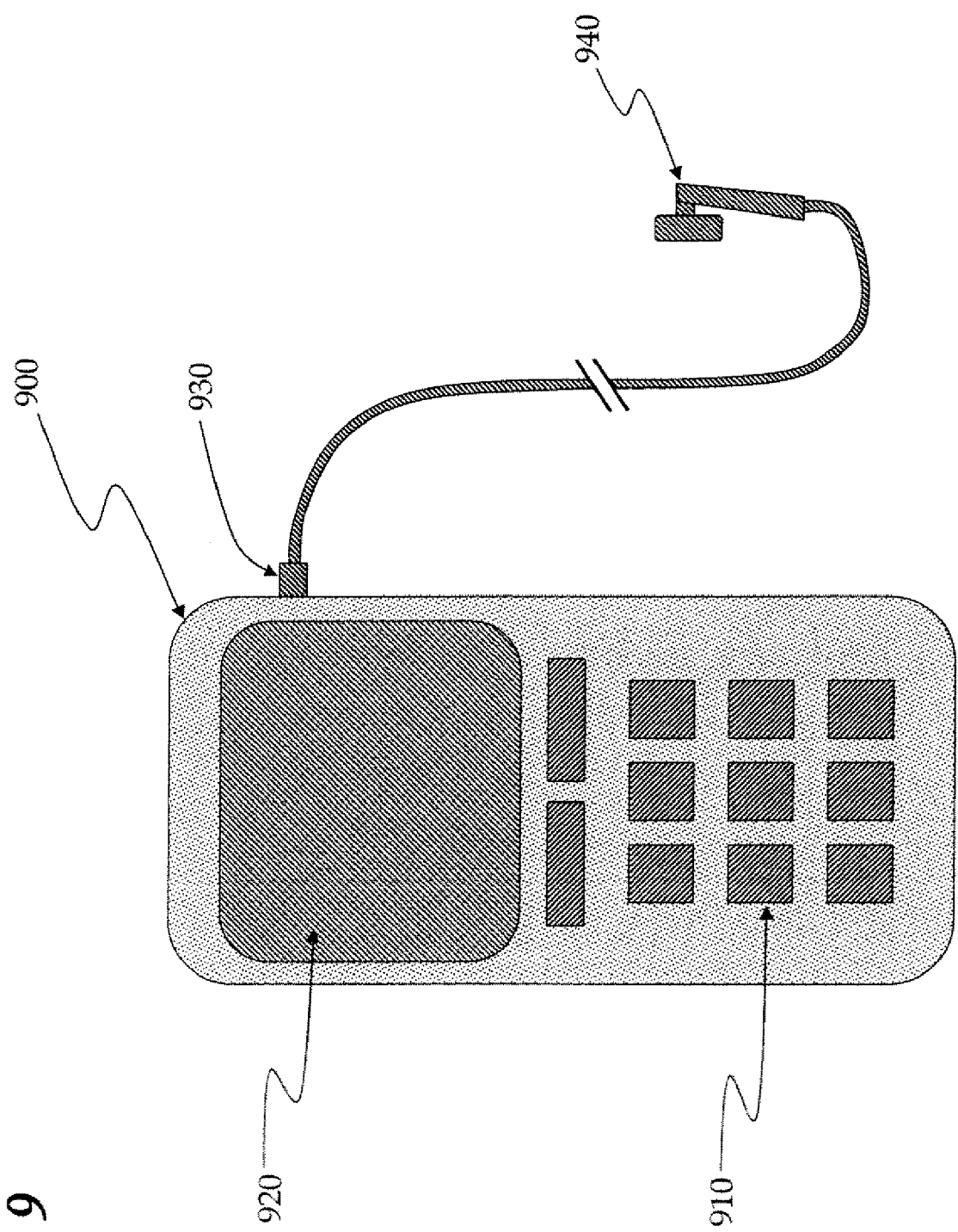
FIG. 9 depicts a portable device including a thin semiconductor device package according to an embodiment of the invention.

According to embodiments of the invention, a device including a package assembly will also include at least one member (input member) configured to allow input to the device. In an exemplary embodiment, an input member is an antenna to provide input of transmitted wireless signals to the device. In the embodiment depicted in FIG. 9, the input member 910 is a keypad for manual entry of, for example, information or instructions, into the device 900. In another embodiment, an input member is an input/output interconnection member (e.g., port, I/O connector) configured to couple with a reciprocal interconnection member. A reciprocal interconnection member may be further coupled with a conductive pathway (e.g., cable) for conveying data to and/or from the device. In still another embodiment, an input member may be a sensor configured to be affected by an ambient condition (e.g., thermal, chemical, physical, radiological), and further configured to influence a response in the device as a result of the affect. In an exemplary embodiment, the ambient temperature surrounding a sensor may influence a response whereby the ambient temperature is quantified by the device and the quantified temperature is visually displayed on an output member of the device. As should also be understood from this example, a device may also include an output member. In embodiments such as that depicted in FIG. 9, wherein an output member 920 is a visual display, exemplary embodiments may include a graphical display (e.g., liquid crystal display (LCD), plasma display), and/or light emitting diodes (LED). In other embodiments, an output member may provide auditory output (e.g. a speaker), or provide output of an electrical signal that may cause a response in another device. In the embodiment depicted in FIG. 9, an output member 930 is an output jack to which a headphone 940 can be connected, the headphone 940 producing audible sound in response to an electrical output from the output member (jack) 930 of the device.

In embodiments of a device having an input device, a thin semiconductor device package assembly may be configured to receive input (e.g., electrical signals) from the input device. Likewise, in embodiments having an output device, a thin semiconductor device package assembly may be configured to transfer output (e.g., electrical signals) to the output device, Therefore, in embodiments, a thin device package will be electrically coupled with at least one of an output device and/or an input device.

While embodiments of the invention may provide particularly compelling benefits for portable devices, no such use limitation should be construed from the descriptions provided herein. Embodiments of the invention may likewise provide benefits when used in relatively larger electronic devices where a limited amount of space is available within a housing of an electronic device, and a thin semiconductor device package may be placed within the limited available space. Also, because a thin semiconductor package may also provide enhanced efficiency in thermal management, an embodiment may be used in an electronic device where such efficiencies provide a benefit. Therefore, it should be understood that only a subset of the possible embodiments of an electronic device employing a thin semiconductor device package are described herein, and that no limitation of embodiments should be construed from the provided description.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

We claim:

1. An electronic device, comprising:
 a thin semiconductor device package comprising at least one thin die coupled with a thin substrate, a mold material disposed at a surface of the substrate and proximate to at least one side of the die, the mold material having a surface that is coplanar with and substantially contiguous with an exposed surface of the die, and having at least one electrically conductive pathway, the pathway having at least a first terminal end disposed at the exposed die surface and providing electrical continuity with at least one conductive element at the exposed die surface, and at least a second terminal end disposed at the coplanar surface of the mold material outside the perimeter of the die; and
 at least one input member.

2. The electronic device of claim 1, wherein the electronic device is configured for portability.

3. The electronic device of claim 1, wherein the device further comprises an output member.

4. The electronic device of claim 1, wherein the thin semiconductor device package assembly is configured to receive input from the input member.

5. A thin semiconductor device package, comprising:
 a thin substrate having at least a first surface;
 at least one thin die having a first surface and a second surface, the first surface being exposed and having at least one electrically conductive element formed thereon, the second surface lying within a plane parallel with a plane of the first surface, the second surface being coupled with the first surface of the substrate, and the die having a perimeter dimension less than that of the substrate;
 a mold material provide at the first surface of the substrate adjacent to at least one side of the die, the mold material having a first surface and a second surface, the first surface lying within a plane substantially parallel with a plane of the second surface, and coplanar with the first surface of the die, and the second surface being coupled with the first surface of the substrate; and,
 at least one electrically conductive pathway wherein at least a first terminal end of the pathway is provided at the first surface of the die and provides electrical continuity with the conductive element, and at least a second terminal end of the pathway is provided at the first surface of the mold material at least partially outside the perimeter of the die.

6. The package of claim 5, wherein the substrate is a thermally conductive material.

7. The package of claim 5, wherein the electrically conductive pathway comprises sintered copper nanopaste.

8. The package of claim 5, wherein the second terminal end of the pathway is electrically coupled with an attachment member.

9. The package of claim 5, wherein the package is a BGA package.

10. The package of claim 5, further comprising coupling at least one solder ball with the at least one second terminal end.

11. An electronic assembly, comprising:

a printed circuit substrate of a wireless communication device; and, at least one thin semiconductor device package coupled with the substrate, the package comprising, a thin substrate having a first surface;

at least one thin die having a first surface and a second surface, the first surface being exposed and having at least one electrically conductive element formed thereon, the second surface being parallel with the first surface and coupled with the first surface of the substrate, the die having a perimeter dimension less than that of the substrate;

a mold material provided at the first surface of the substrate adjacent to the perimeter of the die, the mold material having a first surface and a second surface, the first surface being parallel with the second surface and coplanar with the first surface of the die, and the second surface being coupled with the first surface of the substrate; and, at least one electrically conductive pathway comprising at least a first terminal end provided at the first surface of the die and provides electrical continuity with the conductive element, and at least a second terminal end provided at the first surface of the mold material at least partially outside the perimeter of the die.

12. The assembly of claim 11, wherein the package is at least one of physically and electrically coupled with the substrate by at least one attachment member.

13. The assembly of claim 11, wherein the assembly is physically received at least partially within the housing of the wireless communication device.

14. The assembly of claim 11, wherein the assembly transfers electrical signals with an electronic device.

* * * * *